(12) United States Patent
Viswanathan et al.

(10) Patent No.: US 9,910,083 B2
(45) Date of Patent: Mar. 6, 2018

(54) RECTIFIER DIODE FAULT DETECTION IN BRUSHLESS EXCITERS

(71) Applicant: ROLLS-ROYCE PLC, London (GB)

(72) Inventors: Vaiyapuri Viswanathan, Singapore (SG); Amit Kumar Gupta, Singapore (SG); Chandana Jayampathi Gajanayake, Singapore (SG); Sivakumar Nadarajan, Singapore (SG)

(73) Assignee: ROLLS-ROYCE PLC, London (GB)

( * ) Notice: Subject to any disclaimer, the term of this patent is extended or adjusted under 35 U.S.C. 154(b) by 513 days.

(21) Appl. No.: 14/573,759

(22) Filed: Dec. 17, 2014

(65) Prior Publication Data

US 2015/0198655 A1 Jul. 16, 2015

(30) Foreign Application Priority Data

Jan. 16, 2014 (GB) .................................. 1400702.5

(51) Int. Cl.
*G01R 31/26* (2014.01)
*G01R 23/02* (2006.01)
(Continued)

(52) U.S. Cl.
CPC ......... *G01R 31/2632* (2013.01); *G01R 23/02* (2013.01); *G01R 31/343* (2013.01);
(Continued)

(58) Field of Classification Search
CPC .. G01R 31/2632; G01R 31/343; G01R 31/40; G01R 31/025; G01R 23/02; H02K 11/20;
(Continued)

(56) References Cited

U.S. PATENT DOCUMENTS 4,430,683 A * 2/1984 Kawai ..................... G01R 27/18
361/42
4,471,308 A * 9/1984 Gable ..................... H02J 7/166
322/99

(Continued)

FOREIGN PATENT DOCUMENTS

DE 10244765 A1 4/2003
EP 0306319 A1 3/1989
(Continued)

OTHER PUBLICATIONS

Aug. 14, 2015 Search Report issued in European Application No. EP 14 19 8324.

(Continued)

*Primary Examiner* — Nikolay Yushin
(74) *Attorney, Agent, or Firm* — Oliff PLC

(57) ABSTRACT

A method of detecting a diode fault in an AC signal rectifier circuit, the AC signal rectifier circuit including a plurality of diodes, and being arranged to supply a rectified output voltage to a load, wherein the method includes the steps of deriving an operating value indicative of the ratio of the voltage magnitudes of a first harmonic frequency and another harmonic frequency of the rectified output voltage across the load; and determining whether a fault has occurred in one or more diodes on the basis of the derived operating value. The first harmonic frequency is preferably the fundamental harmonic frequency, and/or the another harmonic frequency is preferably the $6^{th}$ harmonic frequency.

17 Claims, 6 Drawing Sheets

(51) Int. Cl.
*G01R 31/34* (2006.01)
*G01R 31/40* (2014.01)
*H02H 7/125* (2006.01)
*H02K 11/20* (2016.01)

(52) U.S. Cl.
CPC ........... *G01R 31/40* (2013.01); *H02H 7/1255* (2013.01); *H02K 11/20* (2016.01)

(58) Field of Classification Search
CPC ........ H02H 7/1255; H02H 7/065; H02H 7/20; H02H 7/12
See application file for complete search history.

(56) References Cited

U.S. PATENT DOCUMENTS

| | | | | |
|---|---|---|---|---|
| 5,315,527 | A * | 5/1994 | Beckwith | G01R 19/25 324/76.77 |
| 5,453,901 | A | 9/1995 | Lackey | |
| 8,575,942 | B2 * | 11/2013 | Dorr | G01R 19/155 324/326 |
| 2011/0216449 | A1 | 9/2011 | Reschovsky et al. | |

FOREIGN PATENT DOCUMENTS

| | | | |
|---|---|---|---|
| GB | 1001399 A | | 8/1965 |
| WO | WO 2011/109489 A1 | | 9/2011 |
| WO | 2013/004285 A1 | | 1/2013 |

OTHER PUBLICATIONS

Jun. 13, 2014 Search Report issued in British Application No. GB 1400702.5.

* cited by examiner

RECTIFIER DIODE FAULT DETECTION IN BRUSHLESS EXCITERS

FIELD OF THE INVENTION

The present invention relates to the detection of rectifier diode faults, for example in exciter circuits, in brushless generators such as brushless synchronous generators.

BACKGROUND OF THE INVENTION

The brushless synchronous generator (BLSG) is widely used in aircraft and marine vessels for onboard power generation and it is also used as a shaft generator in energy efficient hybrid propulsion systems for marine vessels. The brushless excitation offers increased reliability and reduced maintenance requirements for the generator.

The exciter is a key component of a generator and the generator's output voltage is regulated by controlling the exciter's field current. The main function of the excitation system is to provide variable DC current to excite the main magnetic field in the rotor. Furthermore, it supports short time overload capability, controlling the terminal voltage with suitable accuracy, ensures stable operation and keep machine within permissible operating range.

The exciter machine and the rectifier are mounted on the same shaft as the main alternator. Excitation systems have a significant impact on the generator dynamic performance, availability, quality of generator's voltage and reactive power.

The present invention focuses on detecting a fault in a rotating diode of the rectifier.

Generally, there are two major fault conditions in the rotating rectifier of a brushless excitation system, namely
  i. Open circuit failure
  ii. Short circuit failure The failures could be single-diode failure or multiple-diodes failure, and each could be either short circuit or open circuit fault.

Having removed the need for brushes, commutator and slip rings, direct fault detection in the rotating rectifier in AC brushless exciter becomes very challenging. Nevertheless it is important to detect and react suitably to rotating diode failures.

The output capacity of the exciter is reduced during diode open circuit failure. In this case, the field current increases stress on other devices and also reduce the transient capability of the machine. For this type of failure, the generator is not at any immediate risk of terminal serious damage, therefore it can continue to operate for limited time. However, this increases stresses on the other diodes and could lead to further diode failures. Moreover, the voltage regulator could be damaged due to increased excitation.

A diode short circuit is the most frequent failure condition. During diode short circuit, the output of the exciter is severely affected and the main alternator is unable to provide rated voltage without overloading the exciter. Furthermore, shorted diode is one of the most severe fault conditions, which requires a very large increase in exciter's field current to maintain the alternator voltage. If this fault condition persists, the exciter and/or the voltage regulator could be damaged. In most short circuit diode cases, the generator is forced to shutdown to prevent permanent damage to the overall system.

Hence, there is a need to develop suitable fast and accurate methods for detecting such diode failures.

The prior art discloses some techniques for detecting diode failures.

For example, US20110216449 discloses a method and apparatus for fault detection of series diode in rectifiers, wherein the voltage across one or both of the individual diodes, and/or the voltage across the pair of diodes are measured to determine a voltage ratio. The voltage ratio is then analysed to determine if a diode fault is present. By employing a voltage ratio rather than a fixed threshold, the fault detection can be used at all possible operating voltages, corresponding to machine operating conditions ranging from no load to full load.

The schematic diagram of a synchronous machine with a plurality of diode detection modules and series module connected to a fault detection module are shown in FIG. 1 and FIG. 2 of US20110216449. The transmission of the signal from the rotor to the stator is via a telemetry transmitter module 80 to a telemetry receiver module 90. The transmitter module 80 can sample, digitise and transmit data of the rotating elements, including that of the diode fault detection modules 20A-20F using wireless techniques.

However, this proposed solution uses 12 voltage sensors arranged across the pairs of series diodes. These voltage sensors measure the diode voltage and determine the ratio between two of these voltages, which is then analyzed to determine the fault. However this method is complex due to presence of larger number of sensors and due to the presence of series connected diodes.

U.S. Pat. No. 5,453,901 discloses a diode short circuit detection and protection circuit for excitation system of brushless synchronous machine. An RC (resistor-capacitor) circuit is used for detecting AC voltages in an exciter field winding for the purpose of directly operating a circuit breaker to remove excitation to the field windings and supply, temporarily shorting the AC current through the exciter field winding.

Failure of a single diode short circuit can result in hazardous conditions due to generation of high voltages in the exciter field, high current in the exciter armature, and loss of excitation and control. Thus, a rapid response of a detection and protection system is required in order to prevent subsequent damage to the exciter windings and the voltage regulator.

A shorted diode fault would generate a large AC voltage in the field windings. The protection circuit would, respond to the generated AC voltage by temporary shorting a RC circuit to protect the field winding. The temporary shutdown of the field windings removes all excitation from the generator field, as well as the field supply, which eliminates further damage to the excitation system.

Furthermore, the rotating rectifier adapts a non-standard bridge configuration of parallel-fused diodes redundant topology, which under diode shorted circuit, excessive current will burn the fuse, leaving the redundant branch taking all the rectification purpose, without the need of shutting down the entire generator.

However, under normally balanced operating conditions, i.e. in the absence of rotating diode faults, the exciter armature winding shows highly linear but balanced behaviours. Thus, any diode fault emulated will upset the exciter armature winding balanced behaviour immediately. And, the exciter armature winding exhibits highly imbalanced effects due to the loss of rectification at the main field winding. Thus, the reflected harmonics due to armature reaction effect is seen directly at the exciter armature winding, while exciter field winding will require more time to generate the significant fault signature due to reflected harmonics in the exciter armature winding.

Thus, there is a need for an improved solution to the detection of a diode fault in a rotating diode rectifier circuit, e.g. in a brushless exciter, such as that used in a brushless synchronous generator so that faults can be detected quickly, and preferably with minimal additional burden on, or modification of, the existing circuitry.

SUMMARY OF THE INVENTION

Accordingly, in an aspect, the present invention provides a method of detecting a diode fault in an AC signal rectifier circuit, the AC signal rectifier circuit including a plurality of diodes, and being arranged to supply a rectified output voltage to a load, wherein the method includes the steps of deriving an operating value indicative of the ratio of the voltage magnitudes of a first harmonic frequency and another harmonic frequency of the rectified output voltage; and determining whether a fault has occurred in one or more of the diodes on the basis of the derived operating value.

The step of determining preferably includes the steps of: comparing the derived operating value with a predetermined range of known fault values; and determining that a fault has occurred in at least one of the plurality of diodes if the derived operating value lies within the predetermined range of known fault values (e.g. for a predetermined length of time).

According to the present invention, a fault in one or more diodes of the rectifier circuit can be detected quickly and accurately. This is particularly advantageous when the method is employed to detect faults in the rotating diode rectifiers on the rotor of a BLSG, for example.

Furthermore, because the method can be employed with only a single sensor, or detector, arranged to measure e.g. the voltage across the load, the circuit used to execute the method is relatively uncomplicated and inexpensive.

The predetermined range of known fault values preferably includes: a first sub-range of known first fault values, and a second sub-range of known second fault values.

Accordingly, the method preferably includes: determining that a first fault has occurred in at least one of the plurality of diodes if the derived operating value lies within the first sub-range (e.g. for the predetermined length of time): and/or determining that a second fault has occurred in at least one of the plurality of diodes if the derived operating value lies within the second sub-range (e.g. for the predetermined length of time), the first and second faults being different types of fault. Accordingly, a plurality of different types of fault can be detected quickly and accurately by employing the present invention.

The first and second sub-ranges are preferably mutually exclusive sub-ranges. Preferably, the first and second sub-ranges are consecutive sub-ranges. The first and second sub-ranges are preferably distinguished by a first threshold value, demarcating the boundary between the two sub-ranges.

The predetermined range of known fault values is preferably consecutive with a predetermined range of known operational values. The predetermined range of known fault values and the predetermined range of known operational values are preferably distinguished by a second threshold value, demarcating the boundary between the two ranges.

The second sub-range is preferably consecutive with the predetermined range of known operational values, for example to be bounded by the predetermined range of known operation values and the first sub-range.

The method preferably includes the step of determining that a fault has not occurred in any of the plurality of diodes if the derived operating value lies within the predetermined range of known operational values (e.g. for the predetermined length of time).

The first fault may be a short circuit in at least one of the plurality of diodes. The second fault may be an open circuit in at least one of the plurality of diodes.

Preferably, a fault is determined to have occurred (only) when the derived operational value lies within the predetermined range of known fault values for a predetermined length of time—for example, when the derived operation value lies within the predetermined first sub-range or the predetermined second sub-range for the predetermined length of time.

The method is preferably executed so as to generate, over time, a sequence of operational values. Preferably, a fault is only determined to have occurred if sequentially generated derived operational values lie within the predetermined range of known fault values for a predetermined length of time—for example, when sequentially generated derived operational values lie within the predetermined first sub-range or the predetermined second sub-range for the predetermined length of time.

The deriving step may include the sub-steps of: acquiring (e.g. measuring) the magnitude of the first harmonic frequency of the voltage across the load, acquiring (e.g. measuring) the magnitude of another harmonic frequency of the voltage across the load, and calculating the ratio of the acquired (measured) magnitudes.

In a preferred embodiment, the first harmonic frequency is the fundamental harmonic frequency.

In a preferred embodiment, the another harmonic frequency is the $6^{th}$ harmonic frequency.

The present invention is particularly useful when applied to a BLSG. Therefore, the AC rectifier circuit may be a rotating diode circuit of a brush less synchronous generator (BLSG), and the load may be the rotor field winding of the BLSG.

For example, a method of controlling the operation of a BLSG may include the method of detecting a diode fault in an AC signal rectifier circuit provided to rectify the AC signal provided by the exciter armature winding.

The method of controlling the operation of the BLSG may include the step of stopping operation of the BLSG when it is determined that the fault is a first fault. The method of controlling the operation of the BLSG may include the step of allowing operation of the BLSG to continue when it is determined that the fault is a second fault.

The AC signal rectifier circuit may be a multiphase AC signal rectifier circuit, for example a 3-phase AC signal rectifier circuit. The rectifier may have a respective rectifying diode branch for each phase. Where the number of phases on the AC signal to be rectified is N, the another harmonic frequency is preferably chosen to be 2N.

In another aspect, the present invention provides a detection assembly arranged to detect a diode fault in an AC signal rectifier circuit, the AC signal rectifier circuit including a plurality of diodes, and being arranged to supply a rectified output voltage to a load, the detection assembly including: a sensor arranged to output a sensor signal indicative of the rectified output voltage applied across the load; a processor arranged to receive the sensor signal, to derive an operating value indicative of the ratio of the voltage magnitudes of a first harmonic frequency and another harmonic frequency of the rectified output voltage, and to determine whether a fault has occurred in one or more of the diodes on the basis of the derived operating value.

Preferably, the processor is arranged to compare the derived operating value with a predetermined range of known fault values, and to determine that a fault has occurred in at least one of the plurality of diodes if the derived operating value lies within the predetermined range of known fault values (e.g. for a predetermined length of time).

The predetermined range of known fault values preferably includes a first sub-range of known first fault values, and a second sub-range of known second fault values. Accordingly, the processor is preferably arranged to determine that a first fault has occurred in at least one of the plurality of diodes if the derived operating value lies within the first sub-range (e.g. for the predetermined length of time); and to determine that a second fault has occurred in at least one of the plurality of diodes if the derived operating value lies within the second sub-range (e.g. for the predetermined length of time), the first and second faults being different types of fault.

The first and second sub-ranges are preferably mutually exclusive sub-ranges. The first and second sub-ranges are preferably consecutive sub-ranges. The predetermined range of known fault values is preferably consecutive with a predetermined range of known operational values. Accordingly, the second sub-range is preferably consecutive with the predetermined range of known operational values.

The processor is preferably arranged to determine that a fault has not occurred in at least one of the plurality of diodes if the derived operating value lies within the predetermined range of known operational values for the predetermined length of time.

The first fault may be a short circuit in at least one of the plurality of diodes. The second fault may be an open circuit in at least one of the plurality of diodes.

Preferably, the processor is arranged to determine that a fault has occurred (only) when the derived operational value lies within the predetermined range of known fault values for a predetermined length of time—for example, when the derived operation value lies within the predetermined first sub-range or the predetermined second sub-range for the predetermined length of time.

The processor is preferably arranged to generate, over time, a sequence of operational values. Preferably, the processor is arranged to determine that a fault has occurred (only) when sequentially generated derived operational values lie within the predetermined range of known fault values for a predetermined length of time—for example, when sequentially generated derived operation value lie within the predetermined first sub-range or the predetermined second sub-range for the predetermined length of time.

To derive the ratio, the processor may be arranged to measure the magnitude of the first harmonic frequency of the voltage across the load, to measure the magnitude of another harmonic frequency of the voltage across the load, and to calculate the ratio of the measured magnitudes.

In a preferred embodiment, the first harmonic frequency is the fundamental harmonic frequency.

In a preferred embodiment, the another harmonic frequency is the $6^{th}$ harmonic frequency.

The present invention is particularly useful when applied to a BLSG. Therefore, the AC rectifier circuit may be a rotating diode circuit of a brushless synchronous generator (BLSG), and the load may be the rotor field winding of the BLSG.

For example, an assembly arranged to control the operation of a BLSG may be further arranged to detect a diode fault in an AC signal rectifier circuit provided to rectify the AC signal provided by the exciter armature winding.

The assembly arranged to control the operation of the BLSG may be further arranged to stop operation of the BLSG when it is determined that the fault is a first fault. The assembly arranged to control the operation of the BLSG may be further arranged to allow operation of the BLSG to continue when it is determined that the fault is a second fault.

The AC signal rectifier circuit may be a multiphase AC signal rectifier circuit, for example a 3-phase AC signal rectifier circuit. The rectifier may have a respective pair of rectifying diode branches for each phase. Where the number of phases on the AC signal to be rectified is N, the another harmonic frequency is preferably chosen to be 2N.

BRIEF DESCRIPTION OF THE DRAWINGS

Embodiments of the invention will now be described by way of example with reference to the accompanying drawings in which.

DETAILED DESCRIPTION AND FURTHER OPTIONAL FEATURES OF THE INVENTION

Fundamentally, in a synchronous generator a DC current is provided for a field winding (or coil) mounted on a rotor, so as to produce a rotor magnetic field. The rotor is then rotated about its axis, e.g. by external means. Thus, sometimes the rotor magnetic field is referred to as a rotating magnetic field. A stator is provided with a stator winding (or coil). As the rotor is rotated the rotating magnetic field induces a voltage (an electromotive force) in the stator winding. Typically the stator winding has a plurality of armatures, whereby the rotating magnetic field induces respectively different voltages in each arm at different parts of the cycle. Thus, the multi-armature stator winding will generate a multi-phase (or polyphase) output in accordance with the number of armatures and the spatial relationship between each armature and the rotating magnetic field.

The DC current can be provided to the rotor field winding by means of brushes and slip rings. However, in a brushless synchronous generator, the DC current is provided by a supply circuit mounted on the rotor itself. The supply circuit is typically an AC signal rectifying circuit, for supplying a rectified signal to the rotor field winding. Typically, the supply circuit is provided with an AC signal from an exciter winding, also located on the rotor. The exciter winding has a voltage (an electromotive force) induced in by an exciter field winding located on the stator. The exciter field winding is supplied with a DC current. Thus, as the rotor is rotated, the voltage is induced in the exciter winding.

Typically, the exciter winding includes a plurality of armatures, thereby supplying the AC signal rectifying circuit with a multiphase AC signal. Most exciter armature windings are arranged to provide a 3-phase signal to the AC rectifying circuit.

Accordingly, a respective rectifying sub-circuit (or branch) is provided by the AC rectifying circuit for each phase of the overall output of the exciter armature winding, and a single output is provided for the rotor field winding.

The output of the AC rectifying is ideally DC. However, in practice, the output is not a pure DC signal. It is an approximation of a DC signal based on the frequency and phases of the respective outputs of the exciter armature winding.

The AC rectifying circuit comprises a plurality of diodes suitably arranged to rectify the signals output by the armatures of the exciter armature winding. A fault in one or more diodes is therefore problematic, as it can strongly affect the nature of the DC signal fed to the rotor field winding.

Figure 1:
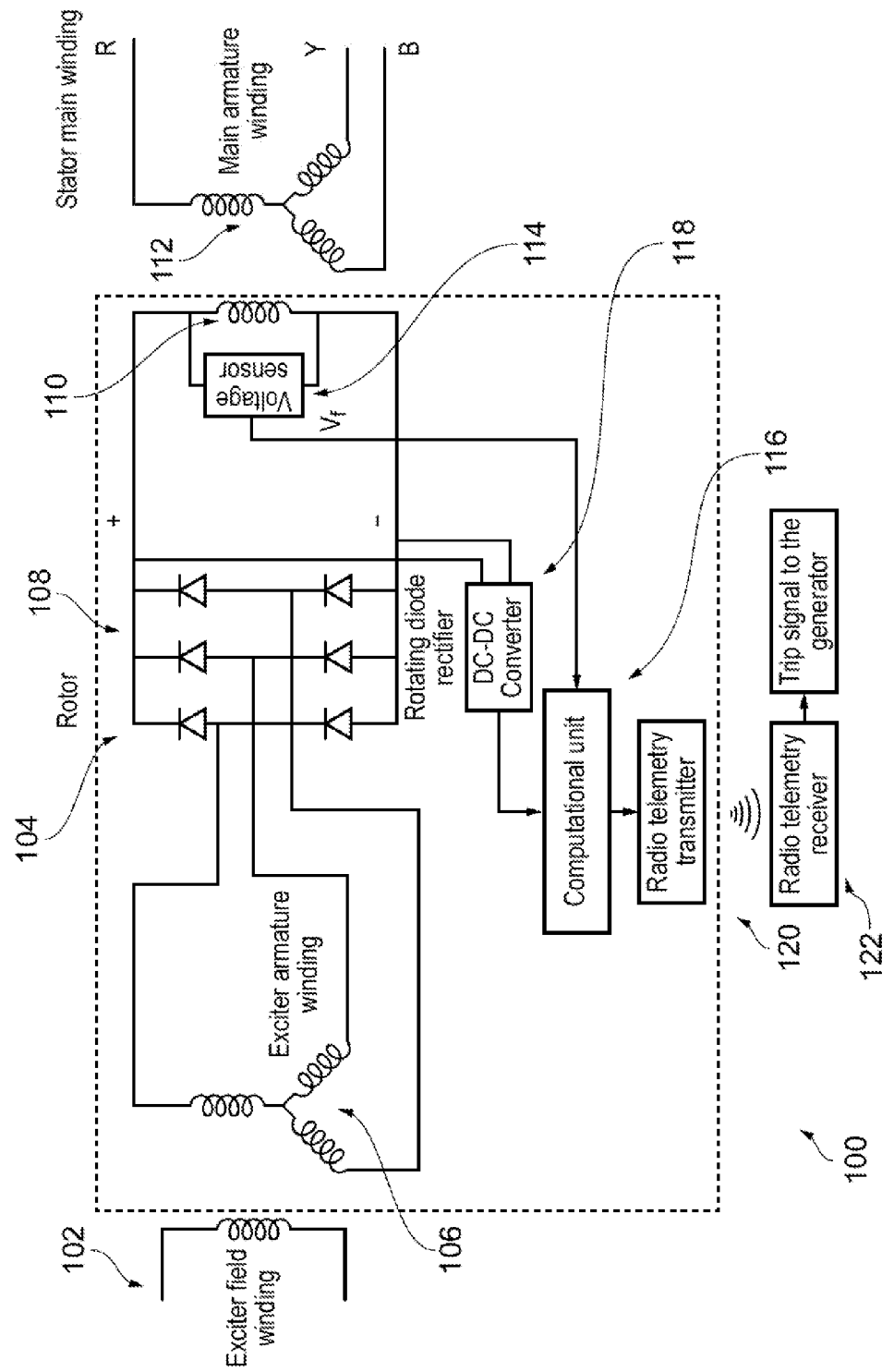
FIG. 1 shows a brushless synchronous generator incorporating a first embodiment of the present invention.

A typical brushless synchronous generator 100, is shown in FIG. 1 with the present invention applied to it.

The generator 100 includes an exciter field winding 102 located on a stator (not shown). Rotor element 104 includes an exciter armature winding 106. Armature winding 106 typically includes a plurality of armatures, so as to output a multiphase (or polyphase) AC signal. For example, in FIG. 1 exciter armature winding 106 includes three armatures, each generating a respective phase of the overall signal output by the exciter armature winding 106. In other words exciter armature winding 106 outputs a three-phase AC signal.

Each phase of the AC signal is fed to a respective rectifying sub-circuit (or branch) of AC rectifying circuit 108. AC rectifying circuit 108 is mounted on rotor 104, and may thus be referred to as a rotating diode rectifier (circuit), and the individual diodes therein may be referred to as rotating diodes.

The rectified outputs from each branch of the AC rectifying circuit combine to provide a rectified output signal to the main field winding 110 located on the rotor 104. Rotation of the rotor induces a current in the stator main armature winding 112. The stator main armature winding 112 typically includes a plurality of armatures, thereby generating a multiphase output signal. For example, in FIG. 1 stator main armature winding includes three armatures, resulting in a three phase output signal.

This present invention provides a fast (responsive) and accurate method to detect a rotating diode fault (or failure) in one or more of the rotating diodes provided in AC rectifying circuit 108. It also provides a circuit to measure and extract the fault signature from a measured signal which allows the type of rotating diode fault (or failure) to be detected. For example, the present invention provides, in an aspect, the ability to distinguish between open and short circuit diode faults (failures).

In an aspect, the present invention is able to achieve this elegant solution employing only a single sensor, which is a significant improvement over the prior art. In a preferred embodiment, the proposed fault detection method relies on only a single voltage sensor 114, which is used to measure the voltage of the main field winding 110 as shown in FIG. 1.

Figure 4:
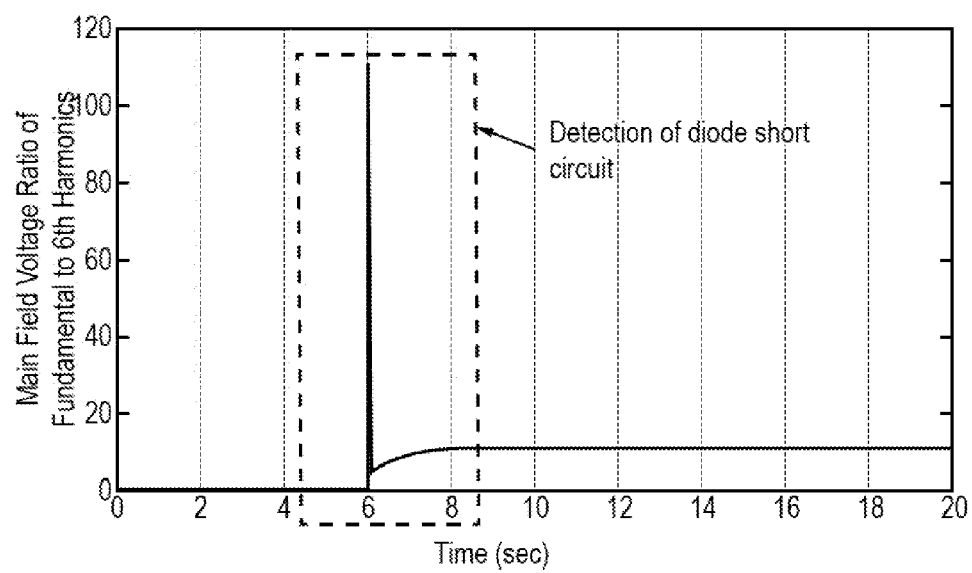
FIG. 4 shows a plot of the rotor field winding voltage ratio of the fundamental to the $6^{th}$ harmonic, when a rotating diode suffers short circuit fault.

The voltage sensor 114 outputs a signal indicative of the voltage measured across the rotor field winding 110 to a computational unit 116. Computational unit is arranged to process the signal received from the voltage sensor 114 to determine whether or not a fault (or a failure) has occurred in one or more of the rotating diodes. This will be explained in more detail below. But, in essence, the measured main field winding DC voltage (as shown in FIG. 4) is used to derive a diode failure indication signal based upon a proposed algorithm/methodology.

A DC-DC converter 118 may also be connected across the main field winding, to supply power to the computational unit. Alternatively, the thermo electric generators or any other energy harvesting method could also be used to generate electrical power for supplying the computational unit 116. Specifically, heat energy could be harvested from diode heat sink or bearing. Self-powered current sensors may be used to eliminate the need of power source.

Figure 2:
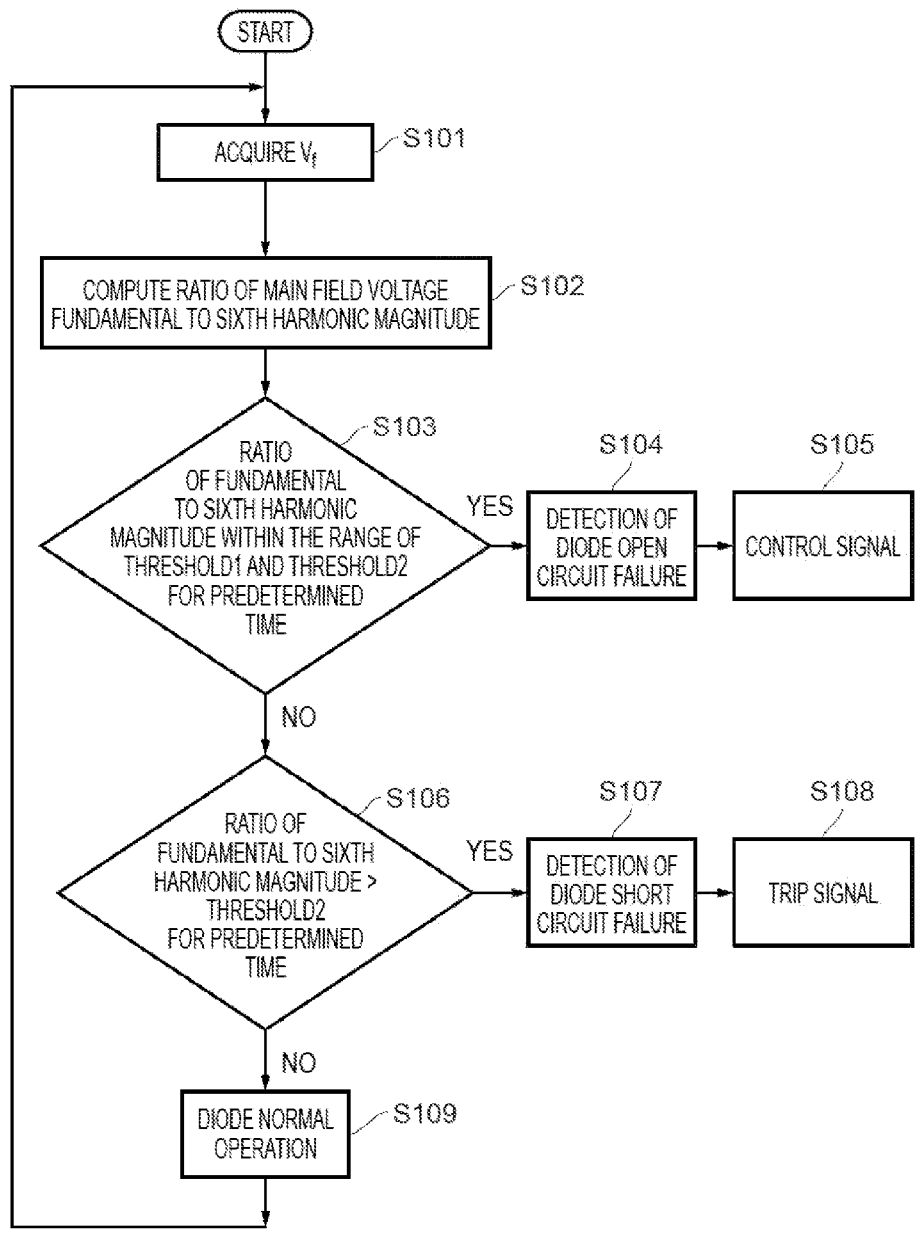
FIG. 2 shows a flowchart representing a method of operation of the brushless synchronous generator incorporating a first embodiment of the present invention.

The methodology for determining whether or not one or more rotating diodes has experienced a fault (or a failure) will now be described with reference to FIG. 2, which shows a flowchart of the proposed fault detection algorithm/methodology.

As will be appreciated from the following description, the present invention allows detection of both rotating diode open circuit fault and rotating diode short circuit fault conditions.

At step S101, the voltage sensor 114 acquires (measures) the voltage across the rotor field winding 110, and transmits to the computational unit 116 a sensor signal indicative of the measured voltage. Alternatively, S101 may be thought of as a step of the computational unit 116 acquiring a (sensor) signal indicative of the voltage measured across a load, for example the rotor field winding. The load presents a frequency dependent impedance to the output of the AC signal rectifying circuit.

At step S201, the computational unit performs processing of the received sensor signal, to derive a value for the ratio of e.g. the fundamental harmonic frequency to another harmonic frequency, for example the $6^{th}$ harmonic frequency, of the measured voltage.

For example, the computational unit 116 may determine the magnitude (amplitude) of the fundamental harmonic frequency of the measured voltage. The computational unit 116 may determine the magnitude (amplitude) of the another harmonic frequency of the measured voltage, for example the $6^{th}$ harmonic frequency, of the measured voltage. The computational unit 116 thereafter calculates the ratio of the respective magnitudes (amplitudes).

Steps S101 and S102 may be performed continuously, to generate a series of derived values over time.

In a preferred embodiment, in step S103, the computational unit checks whether or not the derived value(s) is within a predetermined range of fault values. For example, in practice, the computational unit 116 may check whether the derived value(s) is within a range of (fault) values defined by a first threshold value and a second threshold value. If the derived value(s) is within the first and second thresholds, then this may indicate that a fault has occurred with one or more rotating diodes.

Therefore, the computational unit 116 monitors whether or not a series of derived values, generated over time, remain within the range defined by the first and second threshold values for a predetermined length of time. If the derived values do so, then the computational unit 116 is configured to determine that a fault has occurred.

In a preferred embodiment, when the series of derived values, generated over time, remain within the range defined by the first and second threshold values for a predetermined length of time, the computational unit 116 is configured to determine that an open circuit fault (or failure) has occurred in one or more of the rotating diodes.

In a preferred embodiment, the computational unit 116 is also configured to determine whether or not a different type of fault (or failure) has occurred in one or more of the rotating diodes. Specifically, the computational unit 116 is configured to determine that a short circuit fault (or failure) has occurred in one or more of the rotating diodes. The computational unit 116 makes this determination in step S106.

Step S106 may be performed before, after or simultaneously with step 103.

In step S106 the computational unit checks whether or not the derived value(s) is within another predetermined range of fault values. For example, in practice, the computational unit 116 may check whether the derived value(s) is within a range of (fault) values demarcated from the predetermined range of values referred to in S103 by the second threshold value. In other words, in a preferred embodiment, if the derived value(s) are greater than both the first and second thresholds, then this may indicate that the different type of fault has occurred with one or more rotating diodes.

Accordingly, the computational unit 116 monitors whether or not a series of derived values, generated over time, remain within the range of values above the second threshold value (e.g. whether they exceed the second threshold value) for a predetermined length of time. If the derived values do so, then the computational unit 116 is configured to determine that the different type of fault (or failure) has occurred in one or more of the rotating diodes.

In a preferred embodiment, when the series of derived values, generated over time, remain above the second threshold value for the predetermined length of time, the computational unit 116 is configured to determine that a short circuit fault (or failure) has occurred in one or more of the rotating diodes.

The predetermined length of time in S103 is preferably the same as that in S104, but it may not be.

If the computational unit determines that the derived value is not within the predetermined range referred to in S103 nor within the another predetermined range referred to in S104, then the computational unit may conclude in S109 that the rotating diodes are operating normally.

S109 may be performed simultaneously with S103 and/or S104. Or, it may not be positively performed at all. In other words, no conclusion regarding normal operation of the rotating diodes may be reached. The method may simply monitor for faults, or failures, in the rotating diodes, and thus may only reach a positive conclusion when a fault, or failure, is determined to have occurred.

Thus, if the derived value does not exceed the first threshold value (nor the second threshold value) for the predetermined length of time, the conclusion may be that the rotating diodes are operating normally.

In the discussion above, the example of where the first and/or second thresholds are exceeded is used to determine when a fault has occurred. However, depending on how the derived value(s) is arrived at and on how the threshold values are defined, the same determination may be made when the derived value(s) are found to be less than both the first and second thresholds. For the sake of brevity we have not repeated the discussion for this reverse example, and we will refer here to the example where the derived value(s) exceeding the first and second threshold values is indicative of one or more rotating diodes experiencing the fault (or failure).

Optionally, when it is determined in step S104 that an open circuit fault (or failure) has occurred, then the computational unit may issue a control signal to control the generator's output, as in step S105, for example to define a reduced upper limit to the output of the generator, pending repair of the faulty or failed rotating diode. Optionally, the control signal may be a trip signal for stopping operation of the generator.

Optionally, when it is determined in step S107 that an short circuit fault (or failure) has occurred, then the computational unit preferably issues a trip signal to stop operation of the generator, as in step S108, pending repair of the faulty or failed rotating diode.

So, as has been explained, the rotating diode failure signature can be derived from a rotor field winding voltage measurement, where harmonic analysis is performed and a ratio of e.g. fundamental to e.g. sixth harmonic voltage magnitude is derived. This ratio can be used to detect the rotating diode failure according to the proposed algorithm/methodology by comparison with pre-defined threshold values to determine the faulty condition.

For example, if the ratio is within predetermined normal values, it is detected as a diode normal operation. However, if the ratio is within the values of threshold 1 and threshold 2 for a predetermined time, it is detected as a rotating diode open circuit failure. Further, if the ratio exceeds the threshold value 2 for more than a predetermined time, it is detected as a rotating diode short circuit failure.

The measured data can be processed by a computational unit according to the described algorithm/methodology; and a final control signal can be transferred to a radio telemetry receiver 122 located on the stator via a rotating radio telemetry transmitter 120 located on the rotor.

Receiver 122 collects the control signal from the rotor transmitter 120. The control signal is preferably arranged to trip the generator during diode short circuit failure. If a diode fails open-circuit, this will reduce the output capacity of the exciter. However, the alternator should still be able to deliver rated output with an open-circuit diode for limited period of time. In this condition, the rotor transmitter 120 sends the control signal to the stationary receiver 122 and a generator control unit (not shown) decides the operation of the generator based on load condition and criticality of the load.

The proposed algorithm/methodology is able to detect and identify the diode failure condition in a rotating rectifier circuit within a very short period of time compared to existing methods. The rotor field winding voltage is measured for the fast detection of diode failures. Further, the present invention can be implemented using one voltage sensor mounted in the exciter armature, and optional single wireless control signals can be passed to the stator when a rotating diode failure is detected. This greatly reduces the number of sensors. And it reduces the number of transmitting signals used in the rotor. The proposed detection method is very fast due to direct measurement of main field winding voltage and it is particularly suitable for use with brushless synchronous machines, e.g. generators.

The proposed algorithm/methodology has been verified by the inventors by way of simulation in a MATLAB/Simulink environment. A simulation model of the brushless synchronous generator (BLSG) has been developed to include a rotating rectifier circuit using MATLAB/Simulink software.

Figure 3:
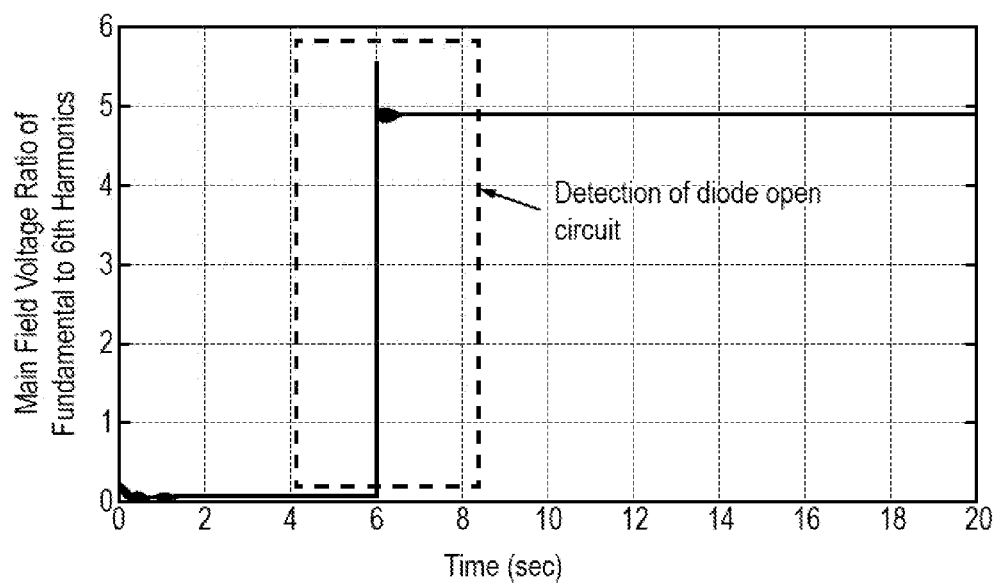
FIG. 3 shows a plot of the rotor field winding voltage ratio of the fundamental to the $6^{th}$ harmonic, when a rotating diode suffers an open circuit fault.

FIG. 3 shows the result of deriving a value for the ratio of the fundamental to sixth harmonic magnitude with one open circuited rotating diode. When the ratio of harmonic magnitude exceeds the threshold value for a pre-determined time, it is detected as a diode open circuit failure. The threshold value may be taken to be 3 or 4 on the y-axis of the plot, for example.

The rotating diode open circuit fault is emulated at t=6 seconds in the plot shown in FIG. 3. Failure (fault) detection is possible within a very short period of time due to direct measurement of main field winding voltage. For example, the fault can be detected with certainty within around 2 seconds of the fault occurring.

FIG. 4 shows the result of deriving a value for the ratio of the fundamental to sixth harmonic magnitude with one short circuited rotating diode. Immediately, it is clear that the values on the y-axis are significantly larger than the values on the y-axis in the plot shown in FIG. 3.

The diode short circuit is emulated at t=6 seconds, the harmonic magnitude ratio exceeds both the threshold value defined for the plot in FIG. 3 and another (higher) threshold value defined for the plot of FIG. 4. For example, the (higher) threshold value may be defined to be 7 or 8.

As can be seen, the derived value persists above the two thresholds for many seconds, whilst failure detection is possible within a very short period of time.

Thus, the present invention provides a method and apparatus suitable for detecting the occurrence of diode failure in an AC signal rectifier circuit, in particular a rotating rectifier provided in an exciter circuit for supply a rotor main winding in a brush less synchronous machine, e.g. a generator.

Optional modifications to the method and apparatus discussed above will now be described by way of example. Features common to the method and apparatus described elsewhere herein will not be repeated for the sake of brevity.

Figure 5:
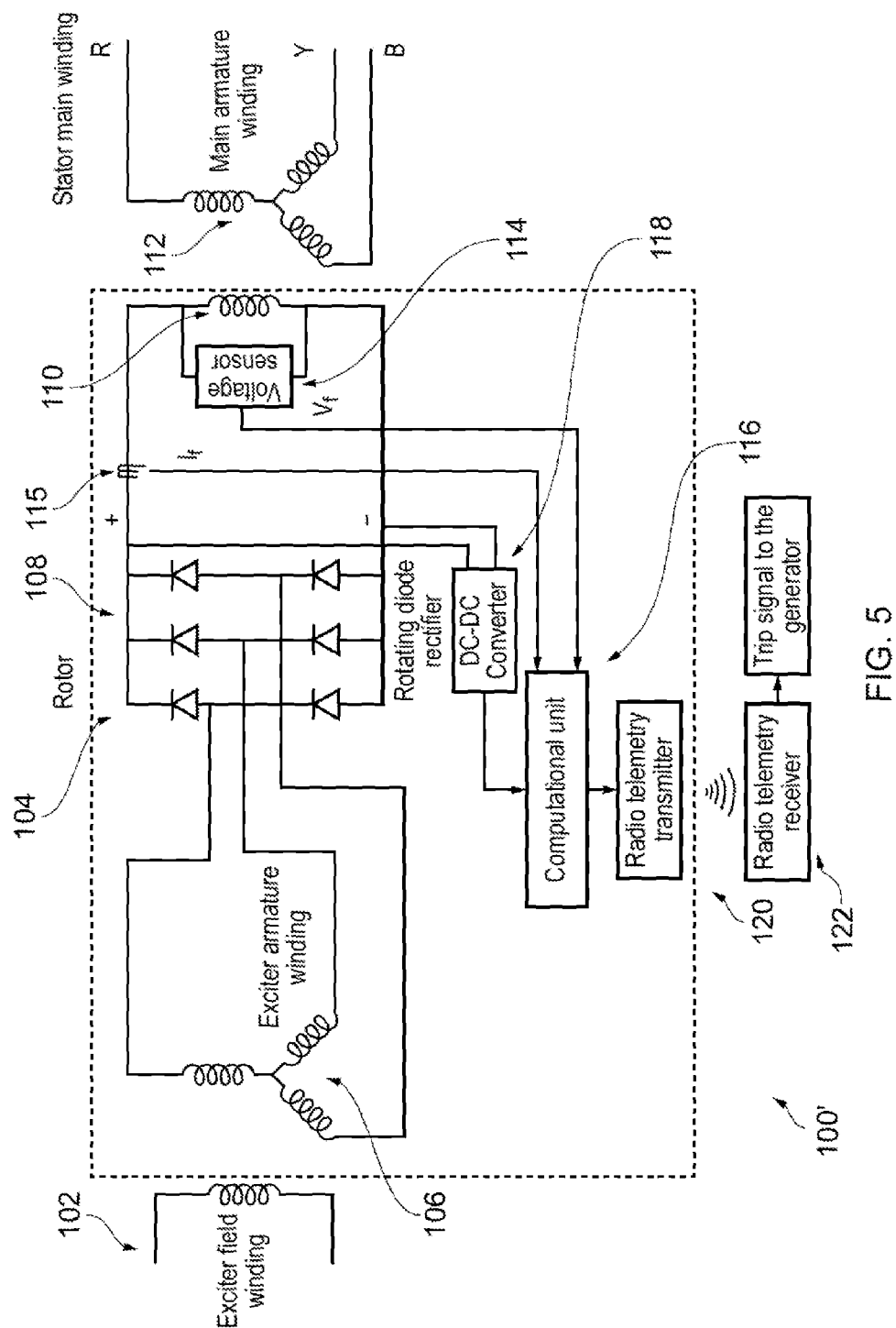
FIG. 5 shows a brushless synchronous generator incorporating another embodiment of the present invention.

As shown in FIG. 5, a modified generator 100' may further include a current sensor 115 to measure the current flowing to the rotor field winding 100. Current sensor 115 may be self-powered.

Thus in addition to receiving a sensor signal indicative of the voltage across the rotor field winding from the voltage sensor 114, the computational unit may receive a current sensor signal indicative of the current flowing to the rotor field winding 110 from the current sensor 115.

Computational unit 116 may therefore be arranged to derive a value for the ratio of the rotor field voltage to rotor field current fundamental harmonic to another harmonic (e.g. $6^{th}$ harmonic) magnitude (amplitude), i.e. using both received signals.

Figure 6:
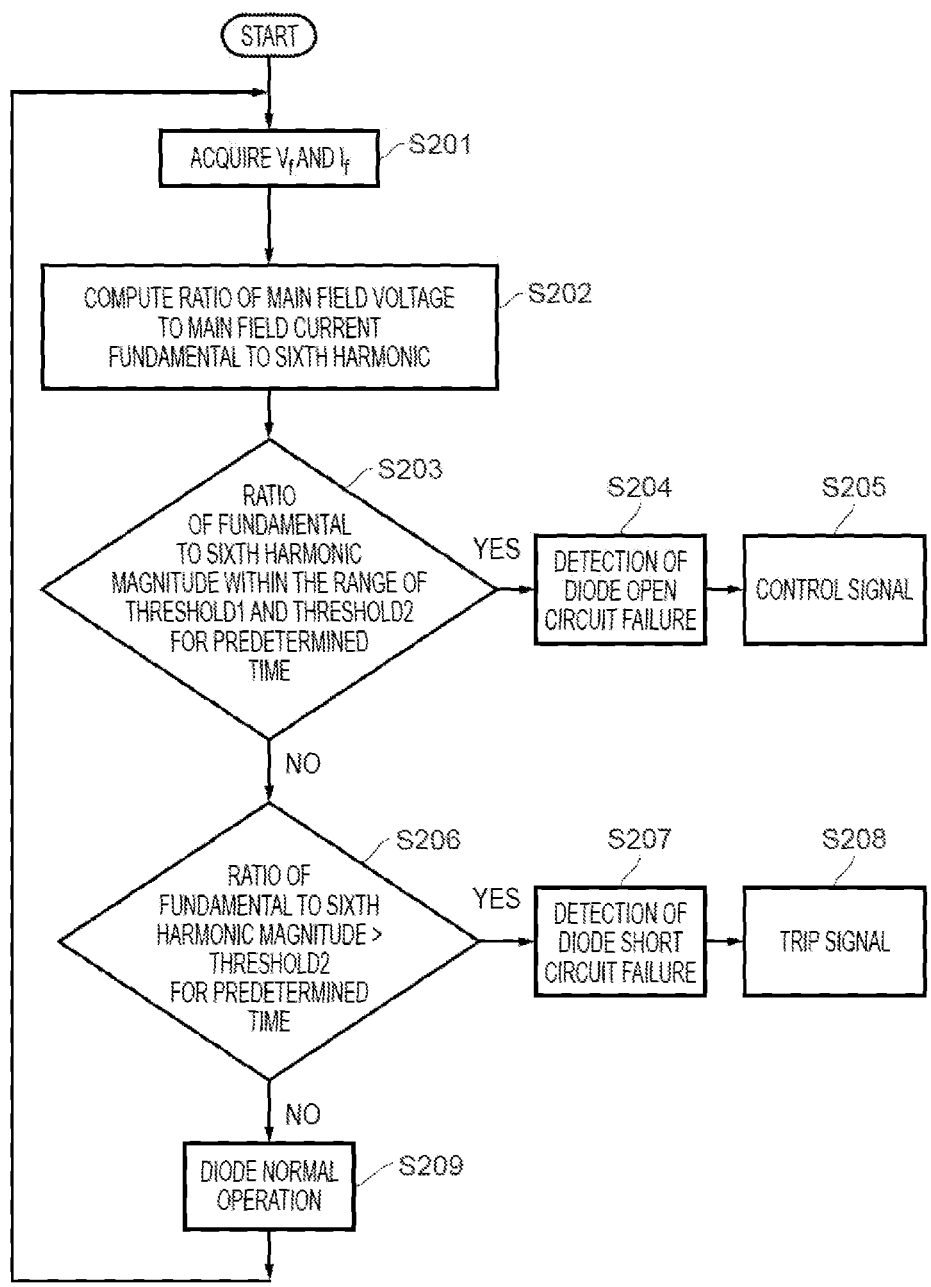
FIG. 6 shows a flowchart representing a method of operation of the brushless synchronous generator incorporating another embodiment of the present invention.

Turning now to FIG. 6, the algorithm/methodology for determining a fault (or a failure) in one or more rotating diodes is shown for the configuration in FIG. 5.

In step S201, the voltage across the main field winding 110 is acquired, e.g. measured, and the current flowing to the main field winding 110 is acquired, e.g. measured.

In step 202, the ratio of the measured voltage to the measured current is calculated; and the ratio of the fundamental harmonic to the sixth harmonic magnitude of the calculated ratio of the measured voltage to the measured current is derived. This derived value is used to provide a fault indicator to detect rotating diode open and short circuit faults.

The way in which the derived value is then assessed relative to the respective predetermined ranges is the same as the previous embodiment.

The computational unit 116 may include a computer program for executing one or more of steps S101-S109. The computational unit 116 may include a computer program for executing one or more of steps S201-S209.

Thus, the present invention may provide a computer program which when executed by a computer executes a method according to the present invention, for example as that described in the appended claims.

The present invention may be embodied in software. The present invention may provide a computer readable medium, on which is stored a set of computer executable instructions, which when executed by a computer perform a method according to the present invention, for example as that described in the appended claims.

It is to be noted that any feature of any embodiment can be introduced into any other embodiment where it is technically possible to do so, unless that introduction is explicitly said to be undesirable.

The present invention is applicable to both small and large induction machines, e.g. BLSG machines) for the fast detection of rectifier failure. For example, requirements for civil and defence aircrafts are growing and driving the need for More Electric Aircraft (MEA). Indeed, advances in power electronics and electrical machines have permitted the use of BLSG coupled to gas turbine engines. Such applications require fast detection of rectifier failure to avoid severe damage to the BLSG exciter circuit (including the exciter armature winding and the rotating diode rectifier circuit) and generator control unit.

Instead of the voltage or current sensors described there may be a current sensor provided to measure the current of the exciter field winding 102. The ratio of the fundamental to the sixth harmonic magnitude may be calculated from the single current measurement. The ratio may then be compared to the pre-determined ranges to determine whether there is a diode failure. In particular, to indicate if there is a short circuit, open circuit or no diode failure.

The invention claimed is:

1. A method of detecting a diode fault in an AC signal rectifier circuit, the AC signal rectifier circuit including a plurality of diodes, and being arranged to supply a rectified output voltage to a load,
wherein the method includes the steps of
measuring a magnitude of a first harmonic frequency of the rectified output voltage across the load with a sensor;
measuring a magnitude of another harmonic frequency of the rectified output voltage across the load with the sensor;
calculating a ratio of the magnitudes of the first harmonic frequency and the another harmonic frequency of the rectified output voltage across the load;
comparing the ratio with a pre-determined range of known fault values for the ratio; and
generating a control signal if the ratio falls within the predetermined range of known fault values for the ratio.

2. A method according to claim 1 wherein the predetermined range of known fault values includes
a first sub-range of known first fault values, and
a second sub-range of known second fault values
and the generating step includes the step of
generating a control signal indicative of a first fault having occurred in at least one of the plurality of diodes if the ratio falls within the first sub-range; and
generating a control signal indicative of a second fault having occurred in at least one of the plurality of diodes if the ratio falls within the second sub-range, the first and second faults being different types of fault.

3. A method according to claim 1 wherein the control signal is generated when the calculated ratio lies within the predetermined range of known fault values for a predetermined length of time.

4. A method according to claim 1 wherein the another harmonic frequency is the 6$^{th}$ harmonic frequency; and/or the first harmonic frequency is the fundamental harmonic frequency.

5. A method according to claim 1 wherein the AC rectifier circuit is a rotating diode circuit of a brushless synchronous generator (BLSG), and the load is the rotor field winding of the BLSG.

6. A method according to claim 2 wherein the predetermined range of known fault values is consecutive with a predetermined range of known operational values; and wherein the second sub-range is consecutive with the predetermined range of known operational values.

7. A method according to claim 2 wherein the first fault is a short circuit in at least one of the plurality of diodes; and/or wherein the second fault is an open circuit in at least one of the plurality of diodes.

8. A detection assembly arranged to detect a diode fault in an AC signal rectifier circuit, the AC signal rectifier circuit including a plurality of diodes, and being arranged to supply a rectified output voltage to a load, the detection assembly including:
  a sensor arranged to output a sensor signal indicative of the rectified output voltage applied across the load; and
  a processor arranged:
    to receive the sensor signal;
    to derive an operating value indicative of the ratio of the voltage magnitudes of a first harmonic frequency and another harmonic frequency of the rectified output voltage across the load; and
    to determine whether a fault has occurred in one or more of the diodes on the basis of the derived operating value.

9. A detection assembly according to claim 8 wherein the processor is arranged to determined that a fault has occurred when the derived operational value lies within the predetermined range of known fault values for a predetermined length of time.

10. A detection assembly according to claim 8 wherein to derive the ratio, the processor is arranged
  to acquire the magnitude of the first harmonic frequency of the voltage across the load,
  to acquire the magnitude of another harmonic frequency of the voltage across the load, and
  to calculate the ratio of the acquired magnitudes.

11. A detection assembly according to claim 8 wherein the another harmonic frequency is the 6$^{th}$ harmonic; and/or the first harmonic frequency is the fundamental harmonic.

12. A detection assembly according to claim 8 wherein the AC rectifier circuit is a rotating diode circuit of a brushless synchronous generator (BLSG), and the load is the rotor field winding of the BLSG.

13. A detection assembly according to claim 8, wherein the processor is further arranged
  to compare the derived operating value with a predetermined range of known fault values, and
  to determine that a fault has occurred in at least one of the plurality of diodes if the derived operating value lies within the predetermined range of known fault values.

14. A detection assembly according to claim 13 wherein the predetermined range of known fault values includes
  a first sub-range of known first fault values, and
  a second sub-range of known second fault values
  and the processor is arranged:
    to determine that a first fault has occurred in at least one of the plurality of diodes if the derived operating value lies within the first sub-range; and
    to determine that a second fault has occurred in at least one of the plurality of diodes if the derived operating value lies within the second sub-range, the first and second faults being different types of fault.

15. A detection assembly according to claim 14 wherein the first fault is a short circuit in at least one of the plurality of diodes; and/or wherein the second fault is an open circuit in at least one of the plurality of diodes.

16. A detection assembly according to claim 14 wherein the predetermined range of known fault values is consecutive with a predetermined range of known operational values; and wherein the second sub-range is consecutive with the predetermined range of known operational values.

17. A detection assembly according to claim 16 wherein the processor is arranged to determine that a fault has not occurred in at least one of the plurality of diodes if the derived operating value lies within the predetermined range of known operational values for a predetermined length of time.

* * * * *